United States Patent [19]
Fujii

[11] Patent Number: 6,080,271
[45] Date of Patent: Jun. 27, 2000

[54] PLASMA SOURCE FOR GENERATING INDUCTIVELY COUPLED, PLATE-SHAPED PLASMA, HAVING MAGNETICALLY PERMEABLE CORE

[75] Inventor: Shuitsu Fujii, Fukuyama, Japan

[73] Assignee: Adtec Corporation Limited, Hiroshima, Japan

[21] Appl. No.: 08/895,351

[22] Filed: Jul. 16, 1997

[30] Foreign Application Priority Data

Oct. 16, 1996 [JP] Japan .................................. 8-295826

[51] Int. Cl.[7] ........................................................ C23F 1/02
[52] U.S. Cl. ................. 156/345; 118/723 I; 118/723 AN
[58] Field of Search ........................... 118/723 I, 723 IR, 118/723 AN; 156/345; 315/111.51; 204/298.06, 298.34

[56] References Cited

U.S. PATENT DOCUMENTS

| | | | |
|---|---|---|---|
| 4,740,268 | 4/1988 | Bukhman | 156/643 |
| 4,948,458 | 8/1990 | Ogle | 156/643 |
| 5,038,013 | 8/1991 | Akazawa et al. | 219/121.43 |
| 5,475,354 | 12/1995 | Valentian et al. | 335/296 |
| 5,792,261 | 8/1998 | Hama et al. | 118/723 I |

FOREIGN PATENT DOCUMENTS 0154078  11/1985  European Pat. Off. .

OTHER PUBLICATIONS

Lee, J.T.C., "A Comparison of HDP Sources for Polysilicon Etching"—Solid State Technology, Aug. 1996.

*Primary Examiner*—Thi Dang
*Assistant Examiner*—Luz Alejandro
*Attorney, Agent, or Firm*—Morgan & Finnegan, LLP

[57] ABSTRACT

The arrangement comprises an antenna coil disposed close to a cover 4 for a Plasma forming chamber 3 and having one side surface opposed to the chamber space of said plasma forming chamber, a magnetically permeable core 7 of ferromagnetic material whose lower surface opposed to said chamber space is formed with a groove 7a in which the conductor of said antenna coil is received, and a susceptor 16 disposed in the lower region of said chamber space for placing an object to be treated 19 thereon.

2 Claims, 4 Drawing Sheets

PLASMA SOURCE FOR GENERATING INDUCTIVELY COUPLED, PLATE-SHAPED PLASMA, HAVING MAGNETICALLY PERMEABLE CORE

FIELD OF THE INVENTION

The present invention relates to an inductively coupled plasma source having a planar type antenna coil and particularly it relates to a device for effecting etching, ashing, CVD (chemical vapor deposition) and sputtering in surface treatment of a wafer material or the like by using uniform planar plasma.

PRIOR ART

Methods of generating high frequency plasma in a plasma processing apparatus, though making differences in the electrode construction, reaction chamber configuration, high frequency power supplying method and frequency, may be classified generally into the parallel flat plate electrode type, the electromagnetic induction coupled type, and the microwave ECR type. The present invention belongs to the electromagnetic induction coupled type (so called, ICP: inductively coupled plasma or TCP; transformer coupled plasma), which includes (1) the helical type in which a coil is wound some turns around a cylindrical chamber, (2) the helical resonance type adapted to resonate with a grounded electrode which is provided outside, (3) the helicon type having a double coil wound externally of a bell jar container in upper and lower regions with the opposite phases, (4) the spiral planar coil type having a spiral planar coil placed in an upper region of a chamber, and (5) the one-turn planar coil type having a one-turn planar coil installed on a chamber.

The principle of operation of the inductively coupled plasma source is that a high frequency induction magnetic field generated in accordance with "Ampere's right-hand screw rule" by feeding a high frequency current to a coil induces a high frequency electric field in accordance with "Faraday's law of induction", which induced electric field fully ionizes a reactant gas to render the latter electrically conductive, and electrons therein, which are negative-charged particles, are accelerated to effect Joule heating, whereby the plasma excitation state in which it is dissociated into ions, electrons and neutral radicals is further enhanced and maintained.

The planar coil type, or equivalent fewer-turn simple solenoid coil type inductively coupled plasma source, to which the invention is directed, produces a high density plasma in a thin region immediately under the coil and hence it is regarded preferable for wafer processing; however, in the processing of large diameter wafers, the source is incapable of satisfying the desire to improve the uniformity of plasma density and the efficiency of magnetic field coupling and has the disadvantage that it unnecessarily radiates harmful electromagnetic wave noise into space.

PROBLEMS TO BE SOLVED BY THE INVENTION

The reason why the conventional planar coil type inductively coupled plasma source has the aforesaid problems is as follows. First, concerning the coil for generating an induced magnetic field, utilizing the energy of the magnetic field generated on the side of a chamber (plasma producing chamber) about the coil for production of plasma, the magnetic flux on the opposite side to or outside of the chamber generates electromagnetic waves. Therefore, the reluctance of the magnetic circuit as a whole relative to the magnetic flux generated by the coil is the sum of the value Rmc for the chamber side and the value Rma for the opposite side thereto, or Rmc+Rma. Since the reluctance in the atmosphere Rma is much higher than that of ferromagnetic material, such as iron, the magnetomotive force drop due to Rma is produced, decreasing the efficiency of magnetic field coupling, and the radiation of unnecessary harmful electromagnetic waves into space forms a main cause of noise and error produced in communications and measured data in an electric or electronic device used in the surrounding atmosphere.

Further, in the spiral planar coil device, since the magnetic fields produced between adjacent coil conductors wound in the same direction by the respective conductors cancel each other, the coil assembly, when seen macroscopically, is equivalent to a flat coil having one turn (the equivalent current is proportional to the number of turns), the area in the chamber where the magnetic field intensity and plasma production rate are high is developed in the form of a corresponding annulus under an equivalent flat annular coil having a diameter corresponding to the mean spiral diameter, thus involving the problem that the plasma distribution also is non-uniform. On the other hand, in the case of the one-turn planar coil type device, it is necessary to increase the coil diameter as the wafer diameter increases, resulting in the plasma production rate being lowered in the coil central region, causing the plasma distribution to be non-uniform. As a solution, if the diffusion method is employed in which the distance to the wafer is increased to make the plasma distribution uniform, a problem arises that as the distance to the wafer increases, the plasma density lowers.

A general object of the present invention is, as to solve today's problem in the plasma processing chamber, to provide an apparatus for uniformly generating a high density plasma under the low pressure condition which is and to provide a construction which increases the magnetic field coupling efficiency and which prevents emission of a high frequency magnetic field, which is liable to become an unnecessary electromagnetic noise, in the surrounding space.

To accomplish the above object, the invention provides an inductively coupled plate-shaped plasma source comprising an antenna coil disposed adjacent the top cover or canopy of a plasma generating chamber and in opposed relation to the chamber space of said plasma generating chamber, and a magnetically permeable core of ferromagnetic material and having a groove, in which the conductor of said antenna coil is received, formed in the lower surface thereof opposed to said chamber space on the side opposite to said chamber space concerning said antenna coil, with a susceptor disposed in the lower region of said chamber space for placing thereon an object to be processed.

In the basic embodiment of the invention, the antenna coil is a planar coil and the winding direction of said coil is alternately reversed for each turn.

According to the above arrangement, if the magnetically permeable core is present in the opposed surface (upper surface) of the plasma generating chamber with respect to the planar type antenna serving as an electronic inductive coupling coil, the magnetic flux from the downwardly directed core surface has directivity toward the plasma generating chamber and most of the magnetic energy is consumed within the plasma forming chamber having a higher reluctance (thus contributing to plasma production); therefore, the magnetic field coupling efficiency is increased. Further, since the magnetic flux passes the magnetically permeable core alone on the opposite side of the plasma generating chamber, there is obtained an effect that emission of unnecessary electromagnetic wave noise into space is prevented.

Further, concerning the basic embodiment of the invention, since the flat coil for magnetic coupling disposed in the upper region of the plasma generating chamber has its winding direction not being of always the same but alternately reversed, the directions of the magnetic fields by the respective conductors between adjacent coil conductors coincide, resulting in the magnetic fields reinforcing each other at the end surface of the magnetic core. This means that with respect to the plasma generating chamber, end surface portions between coil conductors alternately reverse their poles, as N-pole then S-pole, with substantially the same magnetic field intensity, and the magnetic flux is sufficiently uniformly diffused in the chamber of high reluctance, with the result that the magnetic field intensity becomes uniform and so does the plasma being generated. Further, the high magnetic field coupling efficiency makes it possible to generate a high density plasma under low pressure conditions.

BEST MODE FOR EMBODYING THE INVENTION

Preferred embodiments of the invention will now be described with reference to the drawings.

Figure 1:
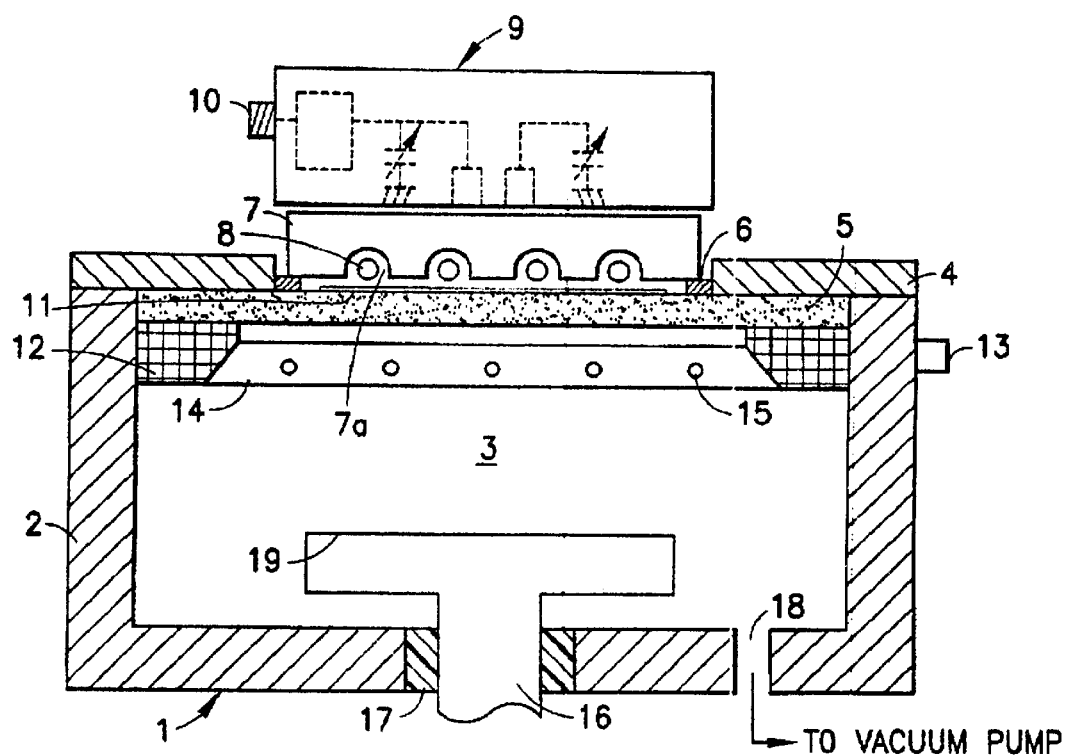
FIG. 1 is a vertical sectional view showing the basic construction of a plasma generating device according to a basic embodiment of the present invention.

FIG. 1 is a vertical section showing a preferred embodiment of the construction of the invention, wherein 1 denotes a metal chamber having, e.g., a cylindrical side wall 2, the interior serving as a plasma generating chamber. In the upper region of the plasma generating chamber 3, a top cover 4 also of metal is supported on the lateral chamber wall 2. A quartz glass plate 5 is mounted on the lower surface of the top cover 4 to isolate the inside and outside of the plasma generating chamber. The top cover 4 itself has an opening circularly punched-out at middle portion thereof and a magnetically permeable core 7 is placed in this circular opening through a peripheral gap spacer 6 supported on the upper surface of the quartz glass 5. On the lower surface of the magnetically permeable core 7, a planar type antenna coil 8 formed in accordance with a coil pattern to be later described is installed in a cancellation winding groove 7a.

A box 9 for an impedance matching unit is placed on the magnetically permeable core 7, and installed in said box are impedance matching elements (to be later described), such as a detector, a load impedance variable capacitor, and a phase variable capacitor. An input connector 10 for RF power is installed on the lateral surface of the box 9.

Supported on the upper surface of the quartz glass 5 is a Faraday's shield plate 11 of nonmagnetic and electrically conductive metal (e.g., Al or Cu) opposed to the lower surface of the magnetically permeable core 8, and a reactant gas supply pipe 12 is installed in the inner surface of the lateral chamber wall immediately below the quartz glass 5 in the chamber 1. This pipe 12 supplies the gas, which is introduced from a reactant gas inlet port 13 projecting outside the lateral chamber wall, to the plasma generating chamber 3 through a plurality of reactant gas feed nozzles 15 formed in the conical inner peripheral surface 14. A susceptor 16 for supporting a semiconductor wafer or other object to be processed extends through the bottom of the chamber 1. The disk-like main body of the susceptor 16 is positioned under the planar type antenna coil 8 and magnetically permeable core 7, and the conical surface 14 of the reactant gas supply pipe 12 is positioned coaxial with an imaginary cylinder connecting the antenna coil 8 and magnetically permeable core 7 to the susceptor 16. The pillar portion of the susceptor 16 is fitted in and supported by the bottom wall of the chamber 1 through an insulator 17 of suitable resin or the like. The bottom wall of the chamber 1 is provided with a vacuum suction port 18.

The susceptor 16 is made of metal and is coated with an insulation film to serve as an object support surface, and applies a dc voltage or bias voltage, which is produced by a bias power source, to the object to be treated (wafer 19) placed thereof, it is possible to impart anisotropy to the etching property. In this case, since the Faraday's shield plate 11 is made of nonmagnetic material, it is possible to impart a predetermined potential thereto to allow said plate to serve as an electrode opposed to the susceptor 16 by utilizing its property of shielding electric field while allowing magnetic field to permeate therethrough.

The magnetically permeable core is formed by sintering Ni—Zn ferrite or carbonyl iron dust whose specific permeability is lower than the former, and is capable of minimizing the consumption of magnetic energy outside the chamber by the coil mounted on the core 7.

Figure 2A:
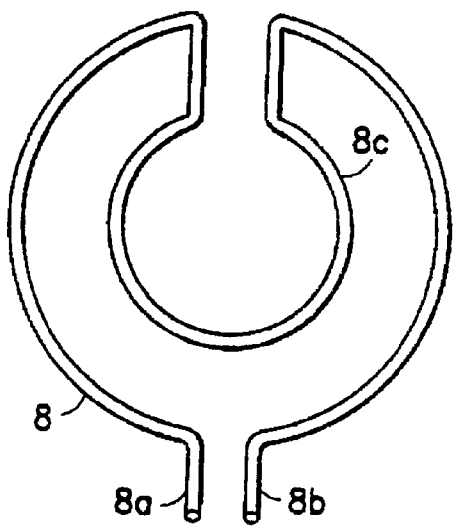
FIGS. 2A and 2B is a plan view showing two modes (A and B) of cancellation winding construction in a two-turn antenna coil of the present invention.
Figure 2B:
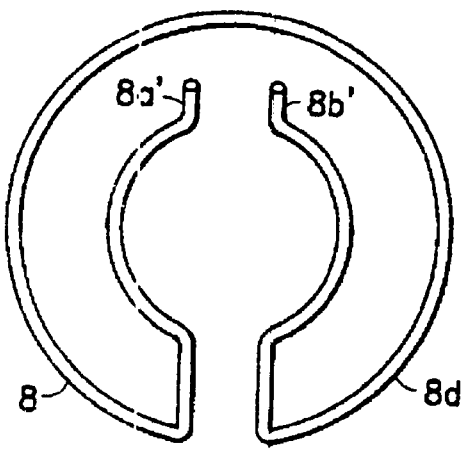

The antenna coil 8, in the case of the double winding shown in FIG. 1, is of cancellation winding construction shown in FIGS. 2A and B. In the case of FIG. 2A, the coil is formed at a place on its outer periphery with a signal electrode terminal 8a and a grounded terminal 8b in adjacent relation thereto, an arcuated coil conductor starting with each of said terminals 8a and 8b being folded back at their diametrically opposite ends over the corresponding sides of the inner circular winding 8c, whereby the inner and outer circular coil portions allow a current to flow therethrough in mutually reversed phase relation. Further, the antenna coil in FIG. 2B is formed with a signal potential terminal 8a' at a place on one side of the inner circular coil and a grounded terminal 8b' on the other side thereof in adjacent relation with the former terminal, these being folded back at their diametrically opposite ends over the outer circular coil portion 8d, whereby the inner and outer peripheral coil portions allow a current to flow therethrough in mutually reversed phase relation.

Figure 3:
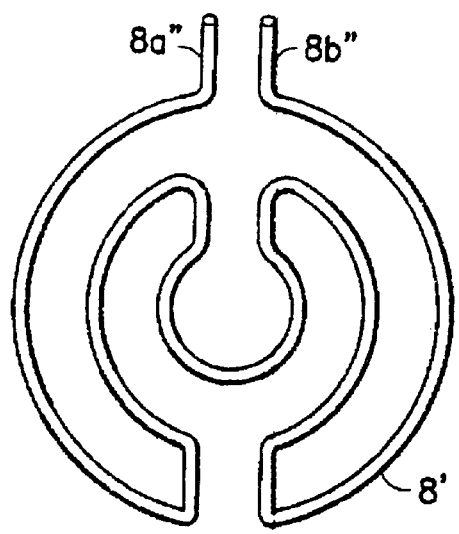
FIG. 3 is a plan view showing a cancellation winding construction in a three-turn antenna coil of the present invention.

An antenna coil 8' shown in FIG. 3 is formed with a cancellation winding in a similar triple winding, wherein a signal potential terminal 8A" is formed at a place on the outer circular coil, with a grounded terminal 8b" formed at another place thereon in adjacent relation to the former terminal, these being likewise folded back at their diametrically opposite ends over the inner peripheral coil portion.

Figure 4A:
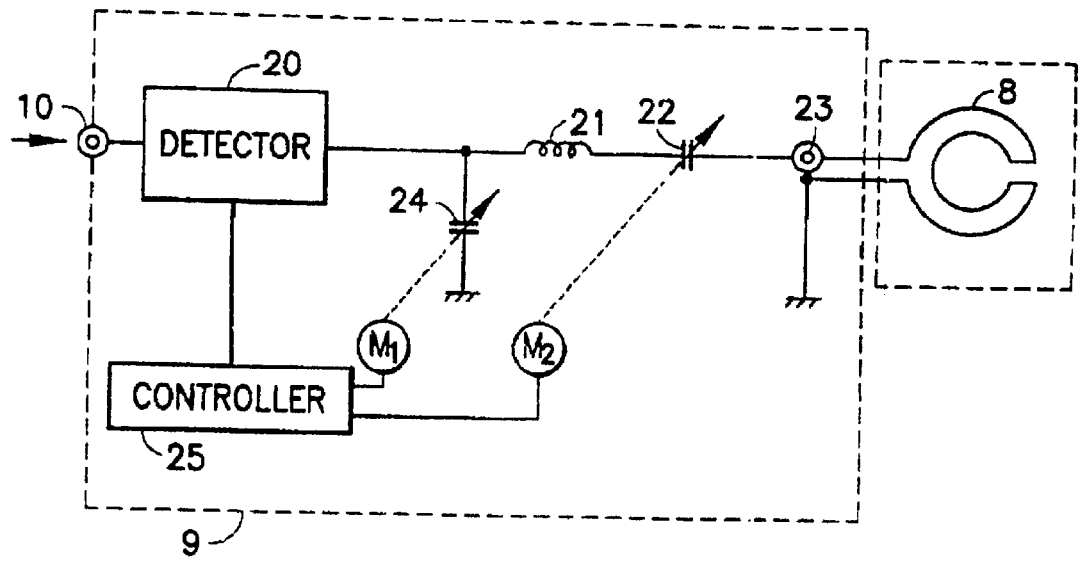
FIGS. 4A and 4B is a circuit diagram showing a circuit (A) using a matching coil and a circuit (B) not using a matching coil in an impedance matching unit used in the device of the present invention.

Such coil is fed with high frequency power through an impedance matching circuit as shown in FIG. 4. Disposed in a box 9 for an impedance matching unit is an impedance matching circuit as shown in FIG. 4A or B. In FIG. 4A, the high frequency power fed through an RF power input connector 10 installed in the matching unit box is passed through a detecting section 20 provided with an instrument transformer, and successively through a matching coil 21 and a phase adjusting capacitor 22, whose capacitance is variable, into an output terminal 23, from which it is fed to the signal potential terminal of the antenna coil 8, flowing back from the grounded terminal. A load impedance adjusting capacitor 24, whose capacitance is also variable, is interposed between the grounded potential and the connecting line between the detecting section 20 and the choke coil 21, said capacitor 24 together with the phase adjusting capacitor 22 being adjusted by the control section 25 through respective servo motors M1 and M2, to emit a control signal according to the detection signal.

Figure 4B:
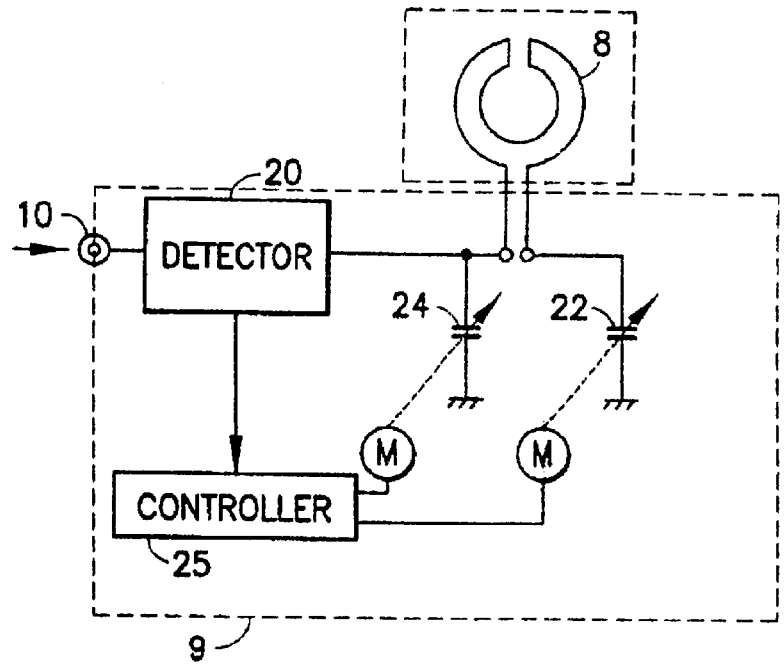

FIG. 4B shows an impedance matching circuit which does not use a matching coil 21. In this circuit, high frequency power is fed directly to the signal potential terminal of the antenna coil 8 from the detecting circuit, said terminal having connected thereto a load impedance adjusting capacitor 24 similar to the one in the circuit of A, and a Phase adjusting capacitor 22 is connected to the terminal end of the coil (the coil terminal referred to as the grounded terminal in A), thereby completing the power supply circuit.

The frequency of the high frequency power is usually 50 kHz–60 MHz in the semiconductor-dry process, and in this embodiment it is constructed as an etching device for 13.56 MHz. This high frequency power is fed to the input connector 10 of the impedance matching unit through a 50Ω-cable and a high frequency electromagnetic field induced by the antenna coil in accordance with this power supply excites the interior of the plasma generating chamber 1. A suitable reactant gas from the gas inlet 13 is fed into this excited space by the nozzles 15 and the wafer 19 is subjected to etching or other treatment in a temperature-controlled state. If desired, a negative voltage from a separate bias power source is imparted for etching to the wafer 19 and susceptor 16. The pressure in the chamber is maintained at 0.01–1 Pa, and the plasma density is 1011–1012/cm–3 and within the range of a large diameter (0.3–0.5 m φ), the adjustment is such that the electron density $\Delta NE/ne<3\%$ and that the ion energy radiated to the wafer is 50 eV or less.

Figure 5:
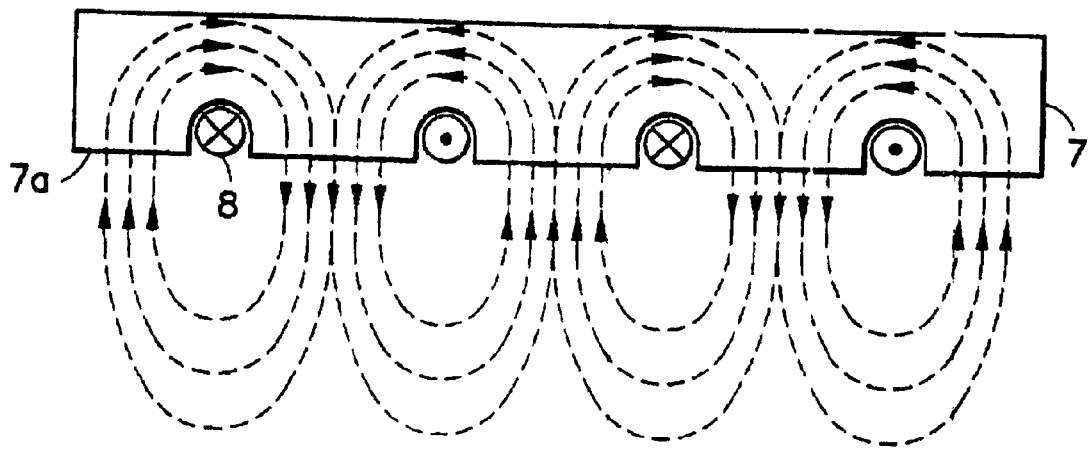
FIG. 5 is a schematic view showing how a magnetic field is generated when an antenna and a permeable core according to the invention are used.

The high frequency magnetic field in the plasma generating floods and earthquakes everywhere chamber 3 assumes the state shown in FIG. 5. For example, in the antenna coil 8 of FIG. 2A or B, suppose that the left-hand side of the outer peripheral coil portion flows upward, the left-hand side of the inner circular coil portion flows downward while the right-hand side of the inner circular coil portion flows upward and the right-hand side of the outer peripheral coil portion flows downward. Then, the magnetic field, as shown in FIG. 5, passes through the magnetically permeable core 7 whose reluctance is much lower than that of the air, and the directions of the magnetic fields coincide with each other between adjacent conductors; therefore, the magnetic fields produced by each of two adjacent coil conductors and added together flow out of or into, and at right angles with, the lower end surface 7a therebetween directed to the chamber of the magnetically permeable core 7, whereby a uniformly diffused electromagnetic field is formed particularly in the wafer surface portion. In the conventional one-turn planar coil type or spiral planar coil type, since the magnetic field is confined into one pattern, it is designed provide uniformity by prolonging the distance between the antenna coil and the object to be treated, as described above, whereby the plasma density at the object is decreased to $\frac{1}{10}$–$\frac{1}{100}$ of that in the plasma concentrated region. However, in the magnetic pattern of the present invention showing in broken lines in FIG. 5, plasma can be formed uniformly with high density without leading to the usual decrease of density.

Furthermore, since the antenna coil 8 is cover from above by the lower end-opened groove of the magnetically permeable core 7, the high frequency power fed to the antenna coil is consumed mostly in the chamber whose reluctance is relatively high (thus contributing to plasma formation).

Further, since the direction of winding of the antenna coil is alternately reversed, this results in the decrease of inductance, making it possible to increase the power supplied to the coil and the frequency, the synthetic effect of theses factors remarkably increasing the supplied power-to-plasma generation ratio, serving to save energy and making it possible to satisfy the requirement of shortening the wafer treating time.

In addition, the planar type coil does not require a cooling mechanism if the supplied power may be 1 kW or less. In the case of supplying high frequency power exceeding 1 kW, the coil conductor is made in the form of a pipe through which a liquid coolant is passed.

Figure 6:
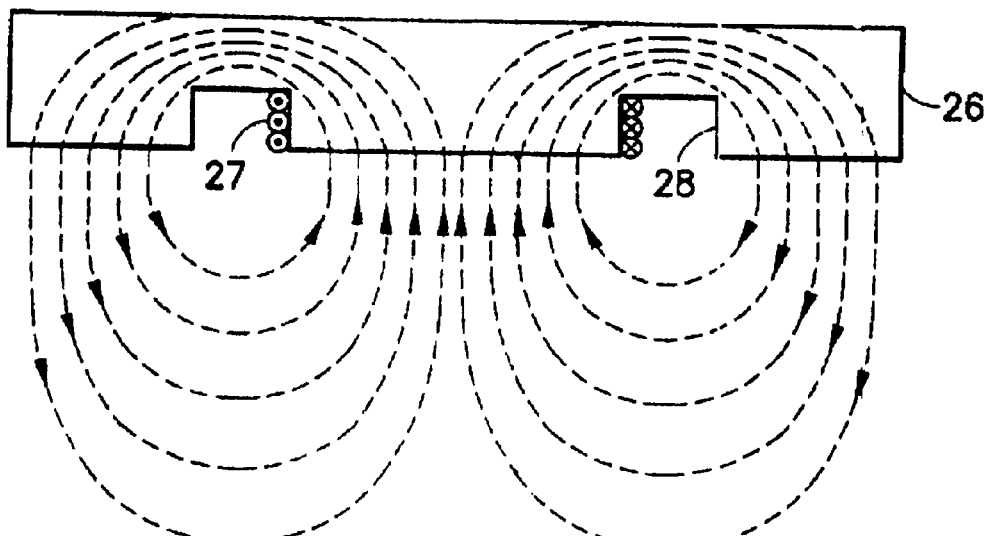
FIG. 6 is a sectional view showing the principal portion of a second embodiment of the invention.

FIG. 6 shows a magnetically permeable core and a coil section in the case, as a second embodiment, where the antenna coil is of simple solenoid type in which the antenna coil is successively close wound. In this case, the magnetically permeable core 26 is formed with a one-turn circulatory groove in the lower surface thereof and the solenoid coil 27 is a three-turn winding which is wound on the inner peripheral wall of the groove 28 of the magnetically permeable core 26.

In the above construction, when a high frequency current (instantaneous value) in the illustrated direction flows through the coil, the instantaneous pattern of the high frequency magnetic field is such that, as shown in broken lines in the figure, the magnetic flux emitted from the periphery of the lower end surface of the core flows back to the middle region of the lower end surface of the core while being diffused in the chamber; outside the chamber, substantially all the magnetic flux passes through the core 26, the propagation of the electromagnetic waves outside the chamber being prevented as in the preceding embodiment. Therefore, in this embodiment also, the same magnetic flux diffusion and uniform and efficient plasma formation are possible. Since other related constructions and circuits can be made according to the preceding embodiment, a description thereof is omitted.

As has been described so far, the present invention provides a plasma source apparatus which is superior in magnetic field conversion efficiency, wherein because of a planar or simple solenoid type coil using a magnetically permeable core, there is no hazard due to electromagnetic waves. Further, the invention provides a process plasma device wherein the direction of winding of the antenna coil is associated with cancellation winding, thereby remarkably increasing the plasma generating efficiency.

What is claimed is:

1. A plasma source for generating inductively coupled plasma comprising: a substantially circular plate-like antenna coil disposed adjacent a top cover of a plasma generating chamber and in opposed relation to a chamber space of said plasma generating chamber, with the direction of winding thereof being alternately reversed for each turn; a magnetic permeable core formed adjacent to said top cover having a groove, in which each turn of the conductor of said antenna coil is separately received, formed in a lower surface of said core opposed to said chamber space; and a susceptor disposed in a lower region of said chamber space for placing thereon an object to be processed.

2. A plasma source for generating inductively coupled plasma comprising: a substantially circular antenna coil consisting of a simple solenoid disposed adjacent a top cover of a plasma generating chamber with one end thereof being in opposed relation to a chamber space of said plasma generating chamber; a magnetic permeable core formed adjacent to said top cover having a circulatory groove, in which adjacent side by side turns of a conductor of said antenna coil are received together, formed in a lower surface of said core opposed to said chamber space; and a susceptor disposed in a lower region of said chamber space for placing thereon an object to be processed.

* * * * *